United States Patent
Yang et al.

(10) Patent No.: US 8,857,619 B1
(45) Date of Patent: Oct. 14, 2014

(54) MECHANISMS FOR WAFER POD AND POD DOOR

(71) Applicant: Taiwan Semiconductor Manufacturing Co., Ltd, Hsin-Chu (TW)

(72) Inventors: Sung-Chun Yang, Hsinchu (TW); Ying-Chi Peng, Zhudong Township, Hsinchu County (TW); Yao-Pin Yang, Zhubei (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 0 days.

(21) Appl. No.: 14/040,902

(22) Filed: Sep. 30, 2013

(51) Int. Cl.
*B65D 85/00* (2006.01)
*H01L 21/673* (2006.01)

(52) U.S. Cl.
CPC .................. *H01L 21/67379* (2013.01)
USPC .......................................................... 206/710

(58) Field of Classification Search
USPC ........... 206/701, 710, 711, 712, 722, 723, 1.5
See application file for complete search history.

(56) References Cited

U.S. PATENT DOCUMENTS

| | | | |
|---|---|---|---|
| 2004/0040884 A1* | 3/2004 | Pai et al. ........................ | 206/710 |
| 2007/0154231 A1 | 7/2007 | Ichimura et al. | |
| 2009/0021829 A1 | 1/2009 | Chen et al. | |
| 2010/0032339 A1* | 2/2010 | Hasegawa et al. ............ | 206/710 |
| 2011/0266192 A1* | 11/2011 | Chiu et al. ..................... | 206/711 |
| 2013/0146503 A1* | 6/2013 | Wang et al. .................... | 206/710 |
| 2013/0299384 A1* | 11/2013 | Fuller ........................... | 206/711 |

FOREIGN PATENT DOCUMENTS

| | | |
|---|---|---|
| TW | 412824 | 11/2000 |
| TW | I225839 | 1/2005 |
| TW | M352130 | 3/2009 |
| TW | I337973 | 3/2011 |
| TW | I347648 | 8/2011 |
| TW | M429684 | 5/2012 |

OTHER PUBLICATIONS

English language translation of abstract of TW 412824 (published Nov. 21, 2000).
English language translation of abstract of TW I225839 (published Jan. 1, 2005).
English language translation of abstract of TW M352130 (published Mar. 1, 2009).
English language translation of abstract of TW I337973 (published Mar. 1, 2011).
English language translation of abstract of TW I347648 (pp. 3-4 of publication, published Aug. 21, 2011).
English language translation of abstract of TW M429684 (published May 21, 2012).

* cited by examiner

*Primary Examiner* — Jacob K Ackun
(74) *Attorney, Agent, or Firm* — McClure, Qualey & Rodack, LLP

(57) ABSTRACT

Embodiments of mechanisms of a wafer pod including a pod door are provided. The pod lock includes a rotating element pivoted on the pod housing and having an anchor element disposed on the rotating body. The pod lock further includes a locking element including a locking body slidably disposed on the pod housing. The pod lock also includes an elastic element disposed on the locking body, and adjacent to the anchor element. When the rotating element is rotated, the rotating element pushes the locking element to move, and the elastic element applies an elastic force on the anchor element.

20 Claims, 12 Drawing Sheets

MECHANISMS FOR WAFER POD AND POD DOOR

BACKGROUND

In the semiconductor industry, wafers are frequently transported to different semiconductor equipment to process different semiconductor processes. Therefore, wafers are contained in wafer pods to protect the wafers from pollution and damage. In general, the wafers are inserted into a cassette, which is disposed on a bottom plate of the wafer pod and covered by a shell.

When the wafer pod is disposed on semiconductor equipment, the bottom plate is unlocked, and the shell is taken away from the bottom plate. Therefore, the semiconductor equipment can take the wafers from the cassette or put wafers into the cassette. When the wafer pod is transported to other semiconductor equipment, the shell is locked on the bottom plate to cover the cassette. However, if the bottom plate is not accurately locked on the shell, the cassette may fall from the bottom plate, causing the wafers to break.

Further, some particles may be generated by some assembled parts of the wafer pod, and the particles may fall onto the wafers. Therefore, there are challenges to improving the structure of the wafer pods.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Various features may be arbitrarily drawn in different scales for the sake of simplicity and clarity. Furthermore, the formation of a first feature over or on a second feature in the description may include embodiments in which the first and second features are formed in direct or indirect contact.

Figure 1:
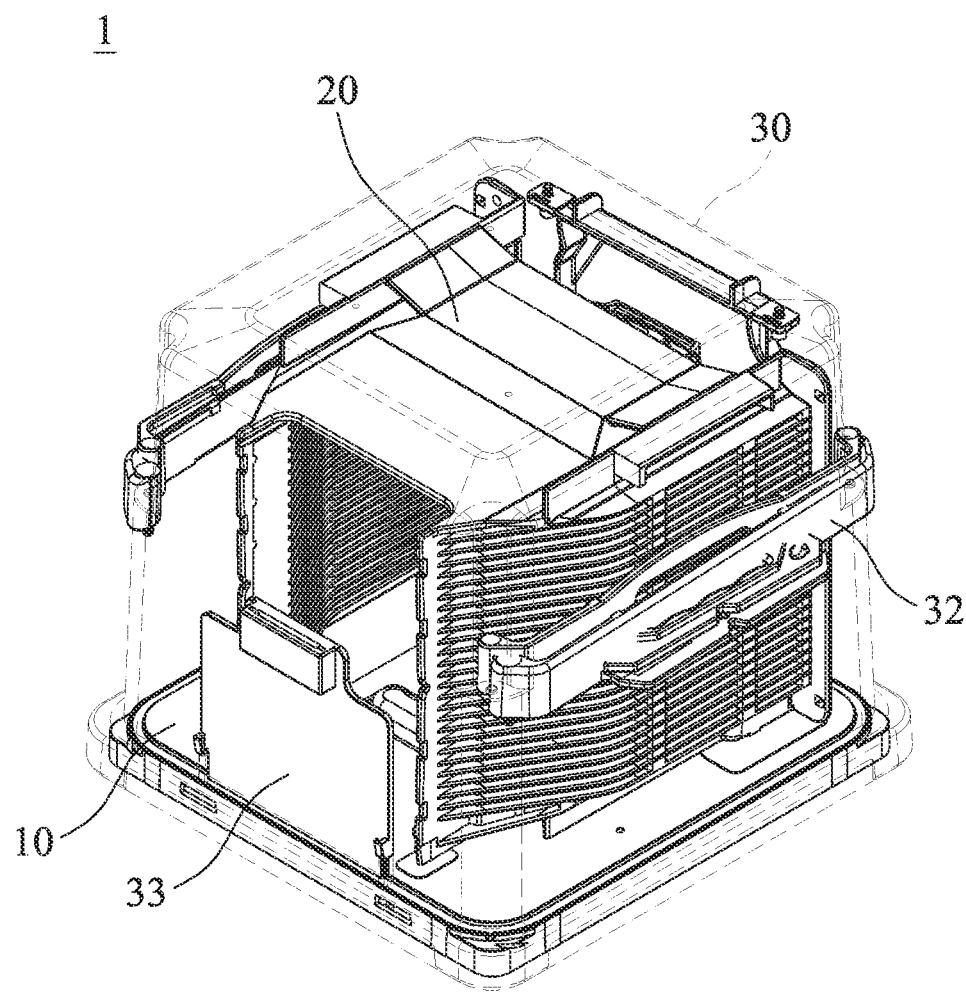
FIG. 1 is a perspective view of a wafer pod in accordance with some embodiments of the disclosure.
Figure 2:
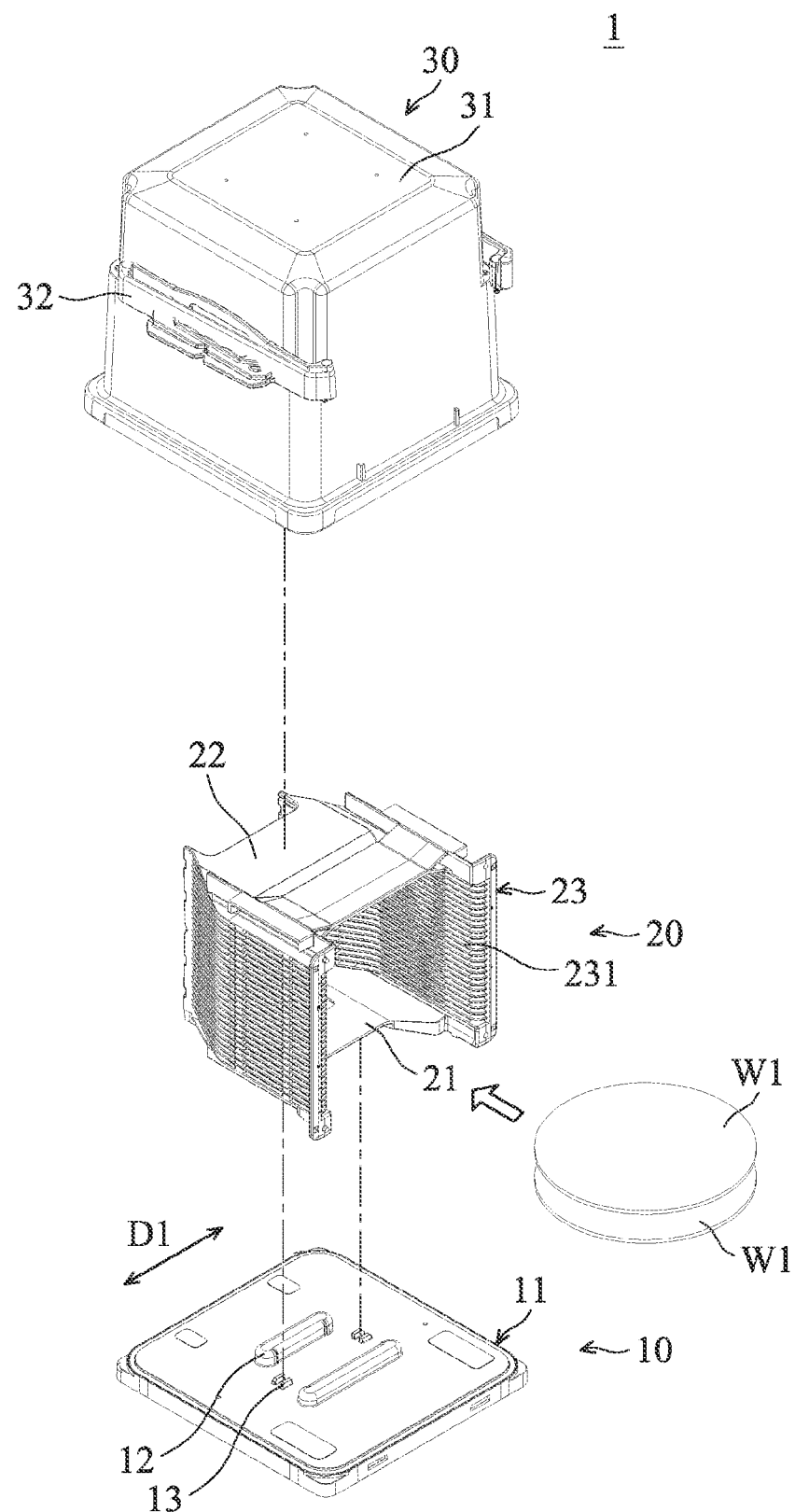
FIG. 2 is an exploded view of the wafer pod in accordance with some embodiments of the disclosure.

FIG. 1 is a perspective view of a wafer pod 1 in accordance with some embodiments of the disclosure. FIG. 2 is an exploded view of wafer pod 1 in accordance with some embodiments of the disclosure. Wafer pod 1 is used for containing wafers W1 (as shown in FIG. 2). Wafer pod 1 includes a pod door 10, a cassette 20, and a pod shell 30. Cassette 20 is disposed on pod door 10 and contains wafers W1. Pod shell 30 is detachably disposed on pod door 10, and covers cassette 20.

Figure 3:
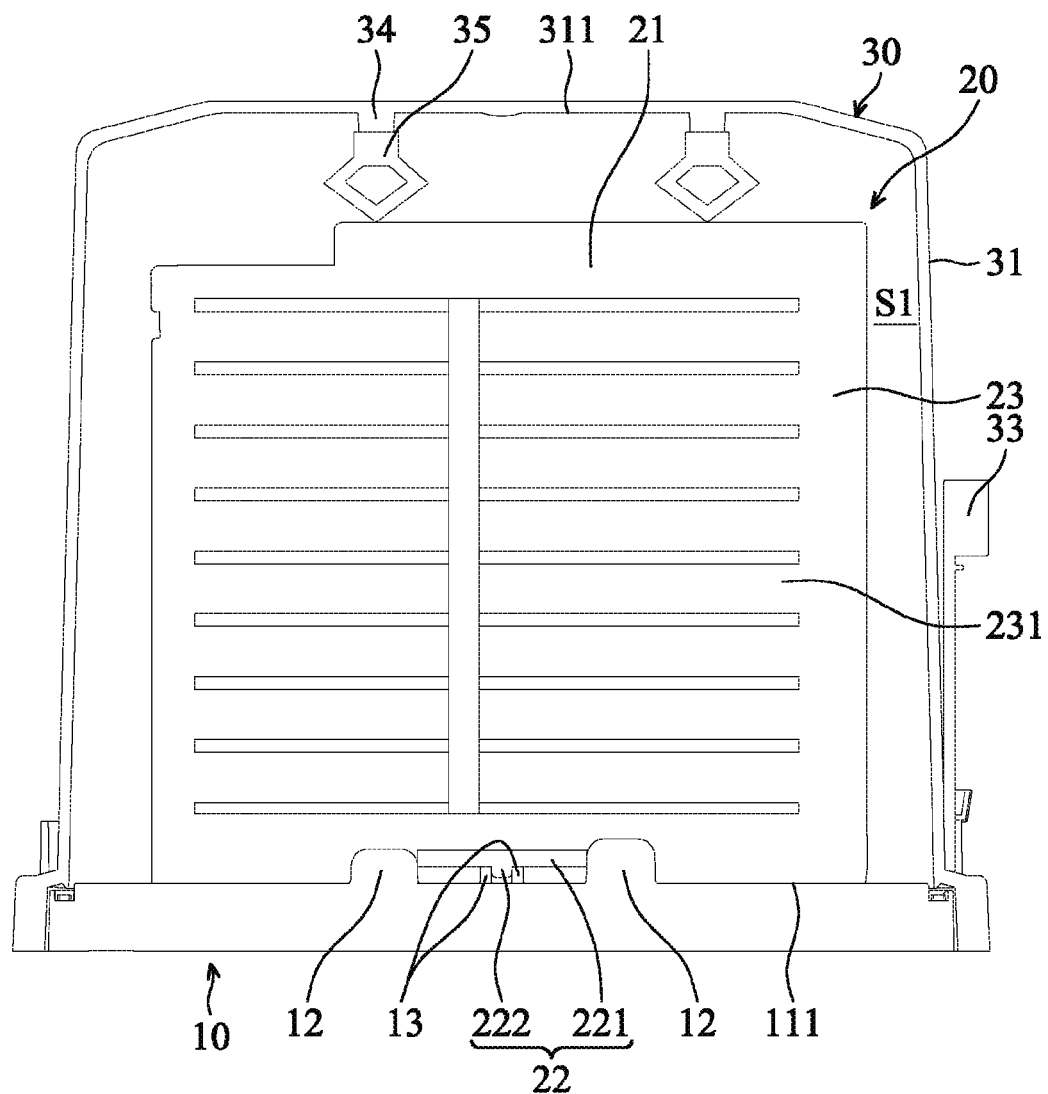
FIG. 3 is a cross-sectional view of the wafer pod in accordance with some embodiments of the disclosure.
Figure 4:
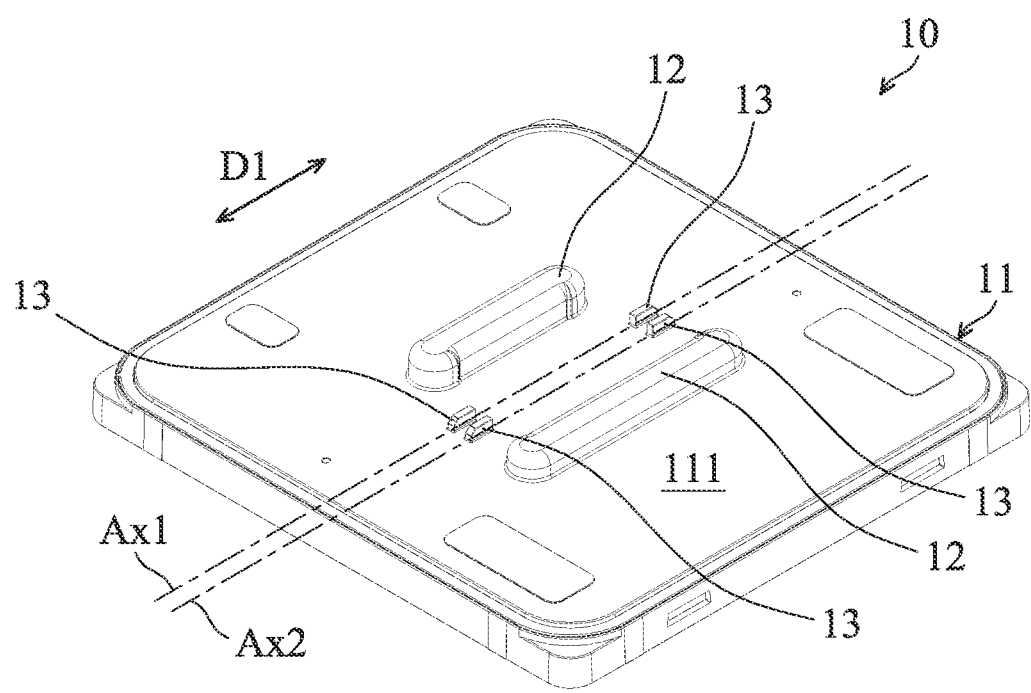
FIG. 4 is a perspective view of a pod door in accordance with some embodiments of the disclosure.

FIG. 3 is a cross-sectional view of wafer pod 1 in accordance with some embodiments of the disclosure. FIG. 4 is a perspective view of pod door 10 in accordance with some embodiments of the disclosure. Pod door 10 is a plate structure. Pod door 10 includes a pod housing 11, outer retaining protrusions 12, and inner retaining protrusions 13. Outer retaining protrusions 12 and inner retaining protrusions 13 are disposed on a top surface 111 of pod housing 11. In some embodiments, there are two outer retaining protrusions 12 and four inner retaining protrusions 13 in FIG. 2.

In some embodiments, outer retaining protrusions 12 are parallel to each other and extend along an extension direction D1. Inner retaining protrusions 13 are substantially between two adjacent outer retaining protrusions 12. Namely, inner retaining protrusions 13 are respectively extended along axes AX1 and AX2, which are between two adjacent outer retaining protrusions 12. The distance between two adjacent outer retaining protrusions 12 exceeds that of two adjacent inner retaining protrusions 13. In some embodiments, pod housing 11, and outer retaining protrusions 12 and inner retaining protrusions 13 are formed as a single piece.

Cassette 20 includes a top portion 21, a bottom portion 22, and two side walls 23. Side walls 23 are connected with top portion 21 and bottom portion 22, and located between top portion 21 and bottom portion 22. In some embodiments, top portion 21 and bottom portion 22 are substantially parallel to each other. Side walls 23 are substantially parallel to each other. Further, side walls 23 are substantially perpendicular to top portion 21 and bottom portion 22.

In some embodiments, cassette 20 is a hollow structure. Cassette 20 is made of temperature-resistant materials, such as polyetheretherketone (PEEK), polyetherimide (PEI), or polybenzimidazole (PBI). In some embodiments, the thermal tolerance of cassette 20 is in a range from about 150° C. to about 350° C. Therefore, wafer W1 may be put into cassette 20 having a temperature greater than 100° C., without getting stuck in cassette 20.

Side walls 23 have wafer slots 231, and wafers W1 may be received in wafer slots 231. Wafer slots 231 are parallel to and distant from each other, and therefore wafers W1 received in wafer slots 231 are parallel to and distant from each other, too. In some embodiments, only the edge of wafer W1 contacts with wafer slots 231. Therefore, the top and bottom surfaces within the edge of wafer W1 may avoid becoming damaged when wafer W1 is inserted into cassette 20 along wafer slots 231.

As shown in FIGS. 3 and 4, bottom portion 22 of cassette 20 includes a retaining plate 221 and a retaining rib 222 disposed on retaining plate 221. In some embodiments, retaining rib 222 is extended along extension direction D1.

The width of retaining plate 221 is substantially the same as the distance between two adjacent outer retaining protrusions 12. The width of retaining rib 222 is substantially the same as the distance between two adjacent inner retaining protrusions 13. Therefore, when cassette 20 is disposed on pod door 10, retaining plate 221 is retained by outer retaining protrusions 12, and retaining rib 222 is retained by inner retaining protrusions 13.

If outer retaining protrusions 12 and inner retaining protrusions 13 are independent and assembled to pod housing 11, some particles may be generated from outer retaining protrusions 12 and inner retaining protrusions 13 due to the movement between outer retaining protrusions 12 and pod housing 11, and between inner retaining protrusions 13 and pod housing 11.

Since outer retaining protrusions 12, inner retaining protrusions 13 and pod housing 11 are formed as a single piece, the particles generated by the friction between outer retaining protrusions 12, inner retaining protrusions 13 and pod housing 11 in wafer pod 1 are decreased. Further, outer retaining protrusions 12 and inner retaining protrusions 13 do not drop off from pod housing 11 to damage wafers W1.

Pod shell 30 includes a shell body 31, handles 32, a label element 33, fixing protrusions 34, and damping elements 35. Handles 32 are disposed on an outer surface of shell body 31. Wafer pod 1 may be carried by holding handles 32. Further, a receiving chamber 51 is formed in shell body 31, and cassette 20 is located in receiving chamber 51. Label element 33 is disposed on an outer surface of shell body 31. Label element 33 includes some information about wafers W1. In some embodiments, label element 33 has various colors for users to notably classify wafers W1.

Fixing protrusions 34 are disposed on an inner surface 311 of shell body 31. Damping elements 35 are disposed on fixing protrusions 34. When pod shell 30 is disposed on pod door 10, damping elements 35 abut against top portion 21 of cassette 20. Therefore, damping elements 35 may prevent cassette 20 from colliding with shell body 31 directly, and the vibration of wafer W1 in cassette 20 may be decreased if wafer pod 1 is impacted or when wafer pod 1 is transported.

Figure 5:
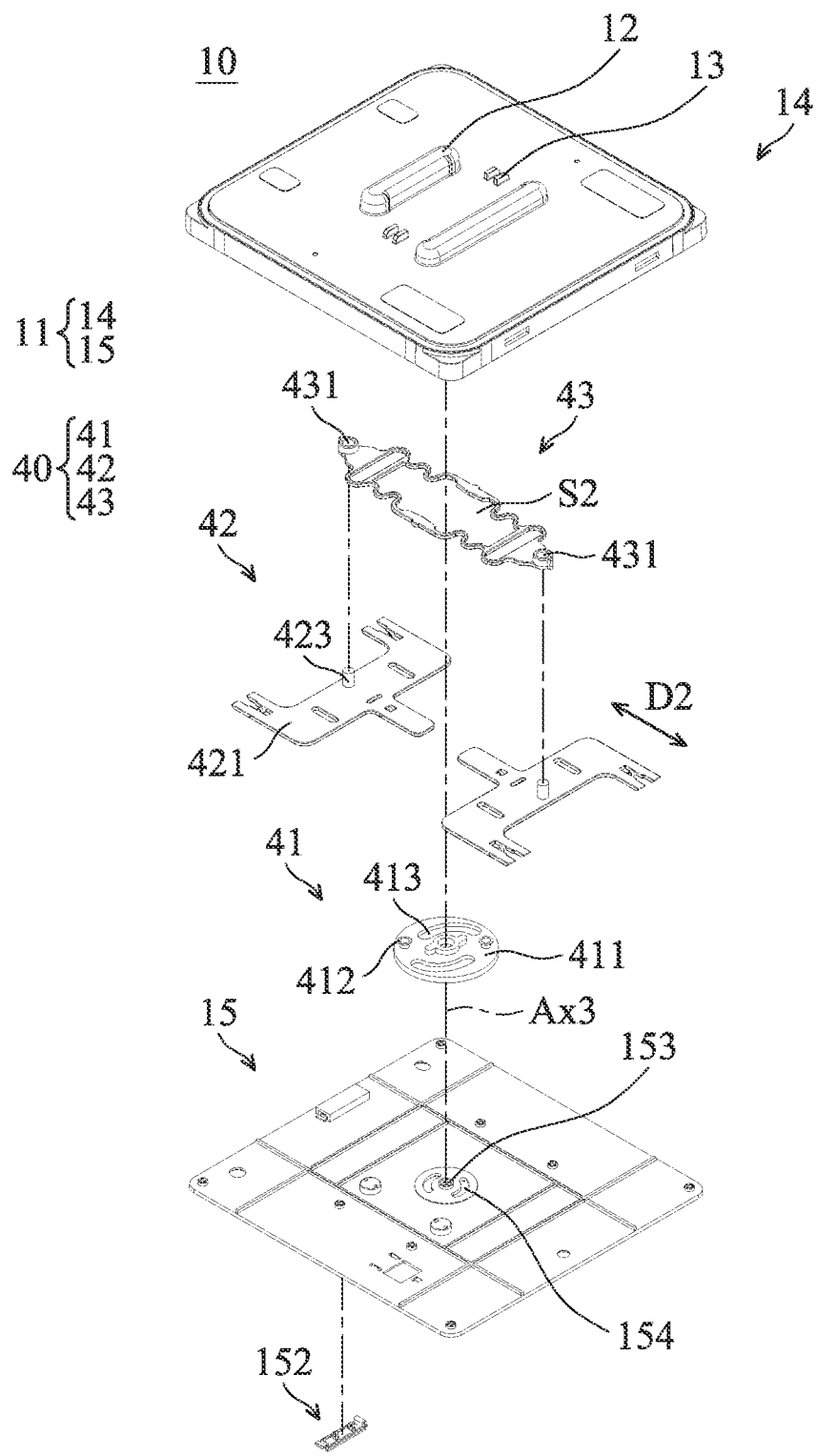
FIGS. 5 and 6 are exploded views of the pod door in accordance with some embodiments of the disclosure.
Figure 6:
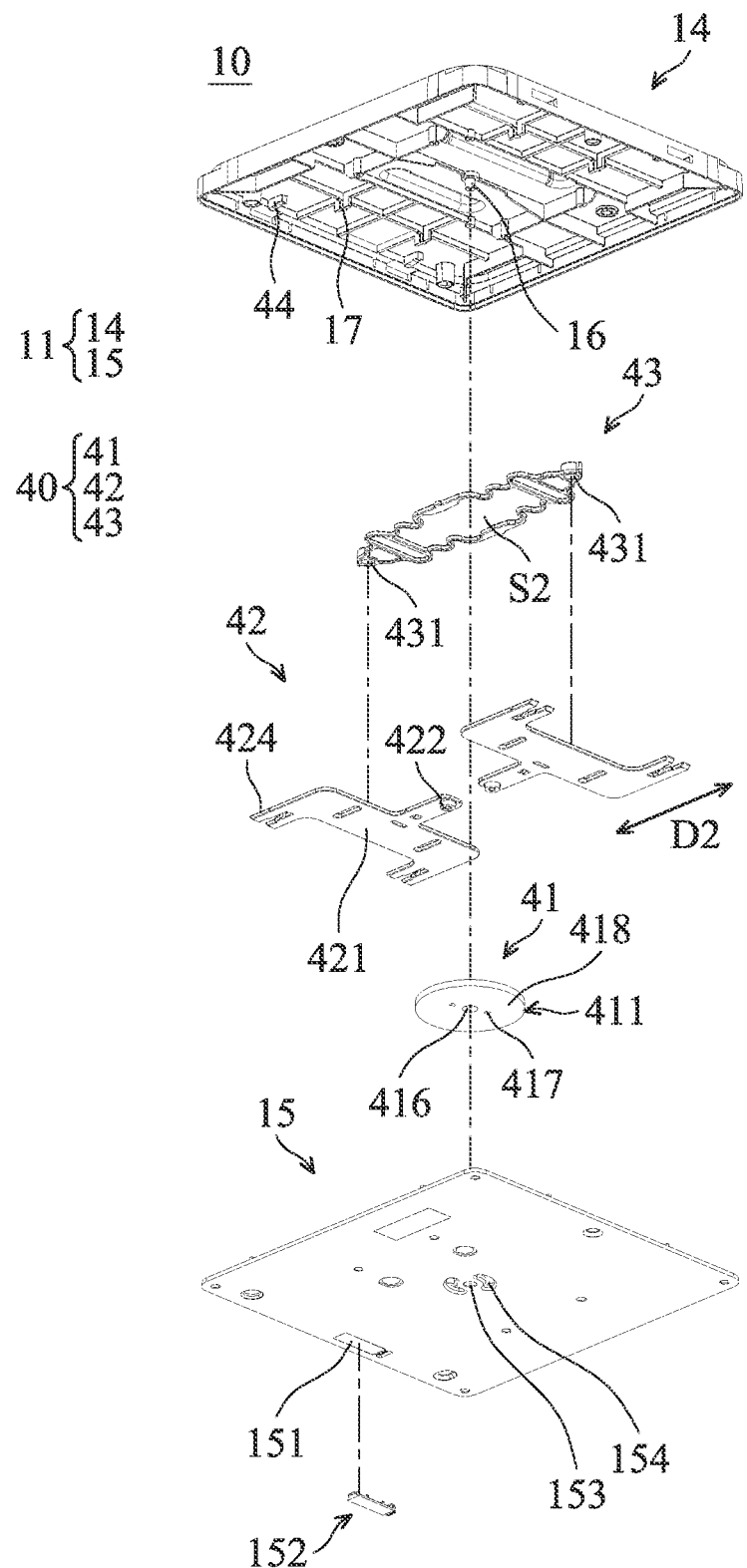
Figure 7:
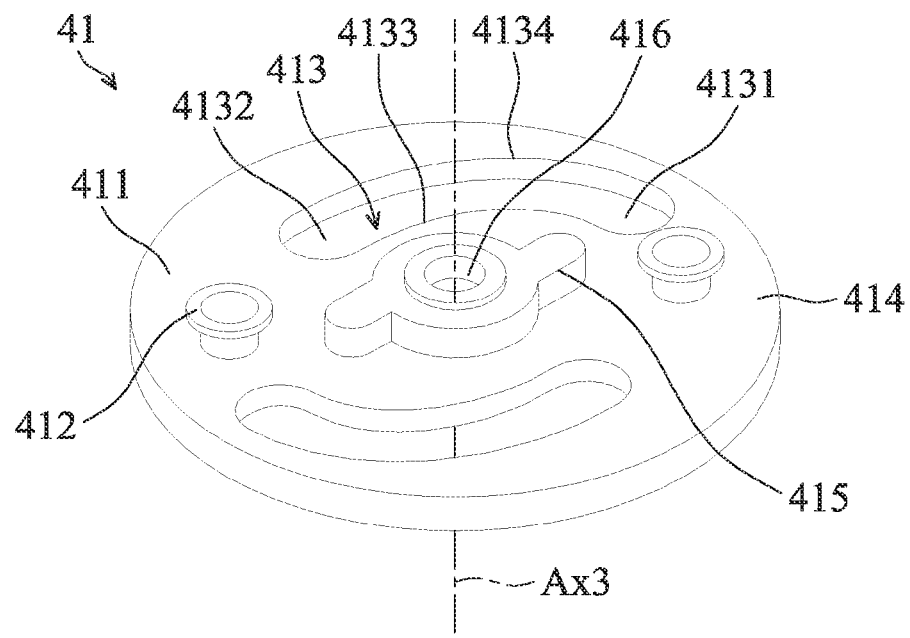
FIG. 7 is an exploded view of a rotating element in accordance with some embodiments of the disclosure.
Figure 8:
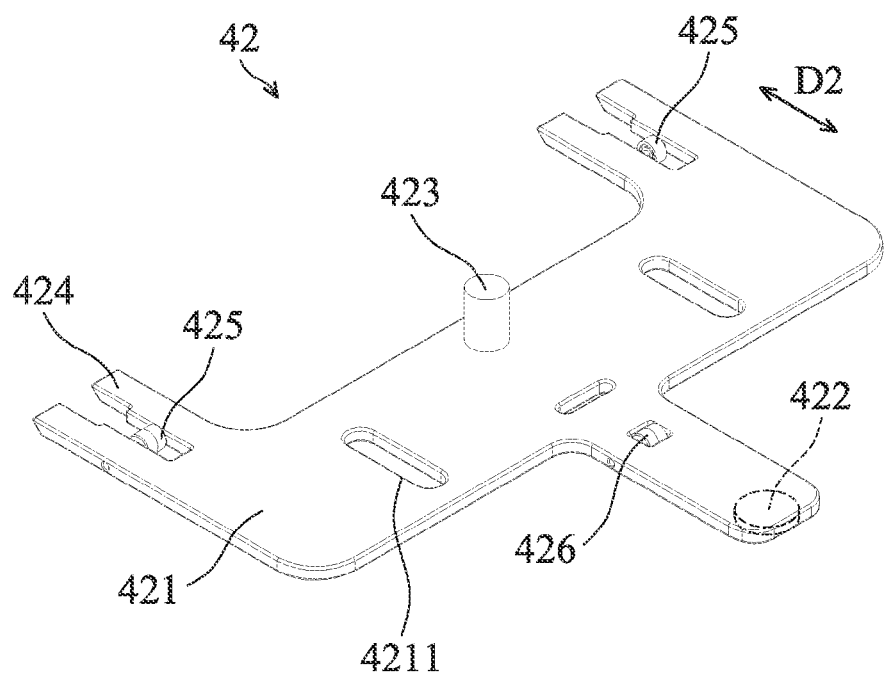
FIG. 8 is an exploded view of a locking element in accordance with some embodiments of the disclosure.

FIGS. 5 and 6 are exploded views of pod door 10 in accordance with some embodiments of the disclosure. FIG. 7 is an exploded view of rotating element 41 in accordance with some embodiments of the disclosure. FIG. 8 is an exploded view of locking element 42 in accordance with some embodiments of the disclosure. Pod housing 11 further includes a top cover 14, a bottom cover 15 disposed on top cover 14, and a shaft 16 connected to top cover 14 and bottom cover 15.

In some embodiments, bottom cover 15 has a receiving groove 151 and a detachable device cover 152 covering receiving groove 151. An electronic device (not shown) may be disposed on device cover 152. Therefore, when pod door 10 is washed, the electronic device is easily detached from pod door 10. In some embodiments, bottom cover 15 has a shaft hole 153. One end of shaft 16 is located in shaft hole 151.

Pod door 10 further includes a pod lock 40 disposed in pod housing 10. Pod lock 40 includes a rotating element 41, locking elements 42, an elastic element 43, and position elements 44. In some embodiments, there are two locking elements 42, and four position elements 44 disposed in pod housing 11.

Rotating element 41 is pivoted on shaft 16 of pod housing 11, and rotates about a rotation axis AX3. Rotating element 41 includes a rotating body 411 and anchor elements 412 disposed on a top surface 414 of rotating element 41. In some embodiments, anchor element 412 is pivoted on rotating body 411. Anchor element 412 is extended parallel to rotation axis AX3. Rotation axis AX3 is located between two anchor elements 412.

Rotating body 411 has rotating grooves 413 formed on top surface 414 of rotating element 41. Rotating groove 413 has a first end 4131, a second end 4132, a recess side 4133 connected to first end 4131 and second end 4132, and a curved opening 4134 located at top surface 414. The distance between first end 4131 and rotation axis AX3 exceeds the distance between second end 4132 and rotation axis AX3. In some embodiments, rotating body 411 is a disk structure. Rotation axis AX3 is perpendicular to rotating body 411 and top surface 414. Rotation axis AX3 is located between two rotating grooves 413. Recess side 4133 faces rotation axis AX3.

Rotating element 41 further has a protrusion portion 415, a shaft hole 416, and latch holes 417. Protrusion portion 415 is disposed on top surface 414. Shaft hole 416 passes through protrusion portion 415 and rotating body 411, and shaft 16 passes through shaft hole 416. Latch holes 417 are formed on a bottom surface 418 of rotating body 411. In some embodiments, latch holes 417 are extended to protrusion portion 415. Bottom cover 15 has through holes 154. An external rotating mechanism (not shown) is inserted into latch hole 417 to rotate rotating element 41.

Locking elements 42 are located at two opposite sides of rotation axis AX3. Each of locking elements 42 includes a locking body 421, a pushing element 422, a fixing element 423, bolt portions 424, sliding elements 425, and wheel 426. Locking body 421 is slidably disposed on pod housing 11. In some embodiments, locking body 421 is a plate structure perpendicular rotation axis AX3. In some embodiments, locking body 421 is a Y-shaped plate structure.

Locking body 421 has guiding holes 4211 extended along a movement direction D2. Pod housing 11 has guiding protrusions 17 respectively disposed on top cover 14 and slidably located in guiding holes 4211. Therefore, locking elements 42 are limited to moving along movement direction D2 by guiding holes 4211 and guiding protrusions 17. When rotating element 41 is rotated, rotating element 41 pushes locking element 42 moving along movement direction D2. In some embodiments, movement direction D2 is perpendicular to rotation axis AX3.

Pushing element 422 is disposed on locking body 421 and is movably located in rotating groove 413. In some embodiments, pushing element 422 is pivoted on locking body 421. Since rotating groove 413 has curved opening 4134, pushing element 422 is moved smoothly in rotating groove 413 when rotating element 41 is rotated. Fixing element 423 is disposed on locking body 421. In some embodiments, fixing element 423 is fixed on locking body 421. Pushing element 422 and fixing element 423 are located at two opposite sides of locking body 421.

Bolt portions 424 are extended from locking body 421. Sliding elements 425 are disposed on locking body 421 adjacent to bolt portions 424. Sliding elements 425 are respectively slidably disposed on position elements 44. In some embodiments, bolt portions 424 are respectively extended along movement direction D2. In some embodiments, sliding element 425 is a wheel pivoted on locking body 421.

Wheel 426 is disposed on locking body 421. When locking element 42 is moved, wheel 426 contacts with pod housing 11 to decrease the friction force between locking element 42 and pod housing 11.

Figure 9:
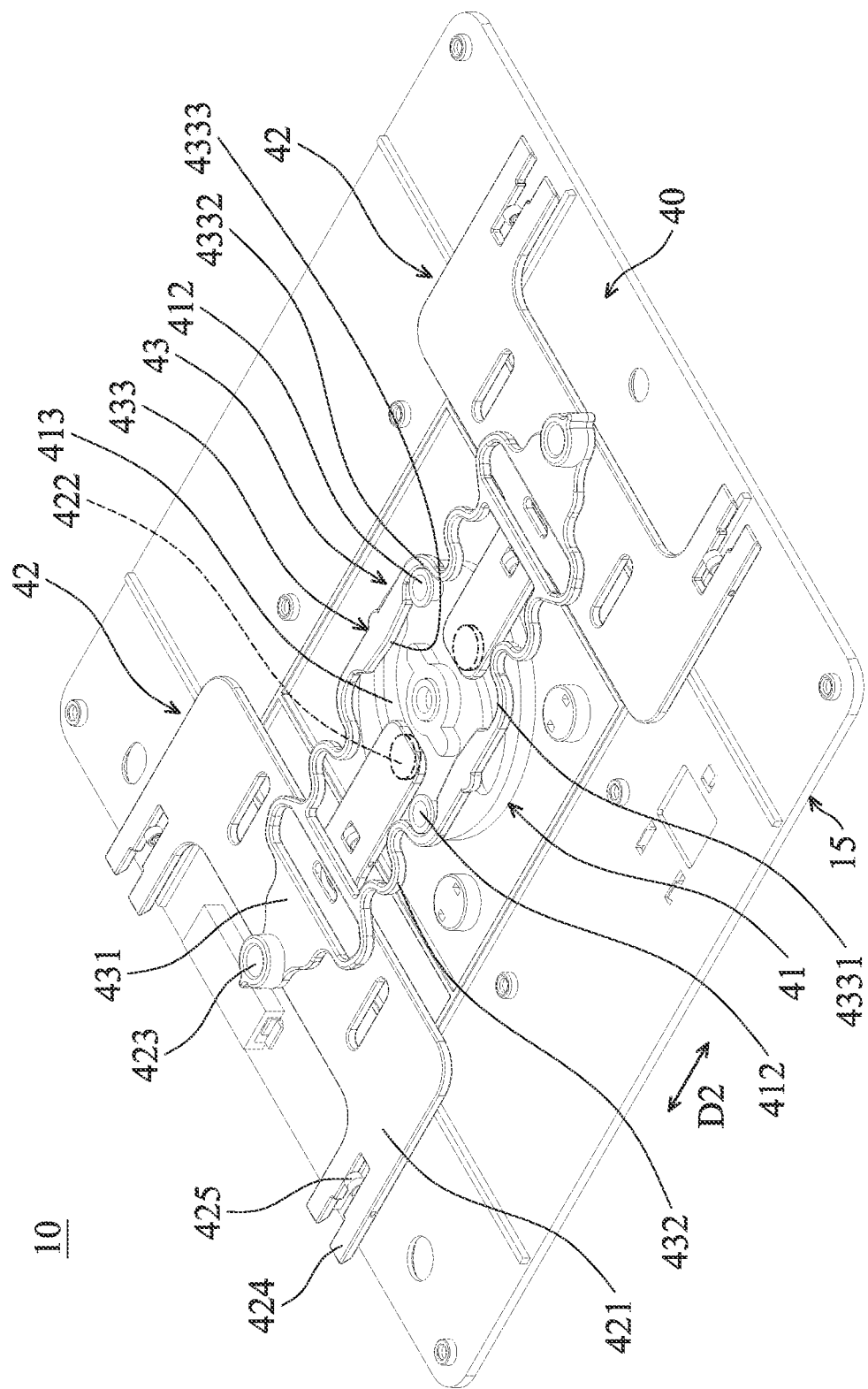
FIG. 9 is a perspective view of the pod door without a top cover in accordance with some embodiments of the disclosure.
Figure 10A:
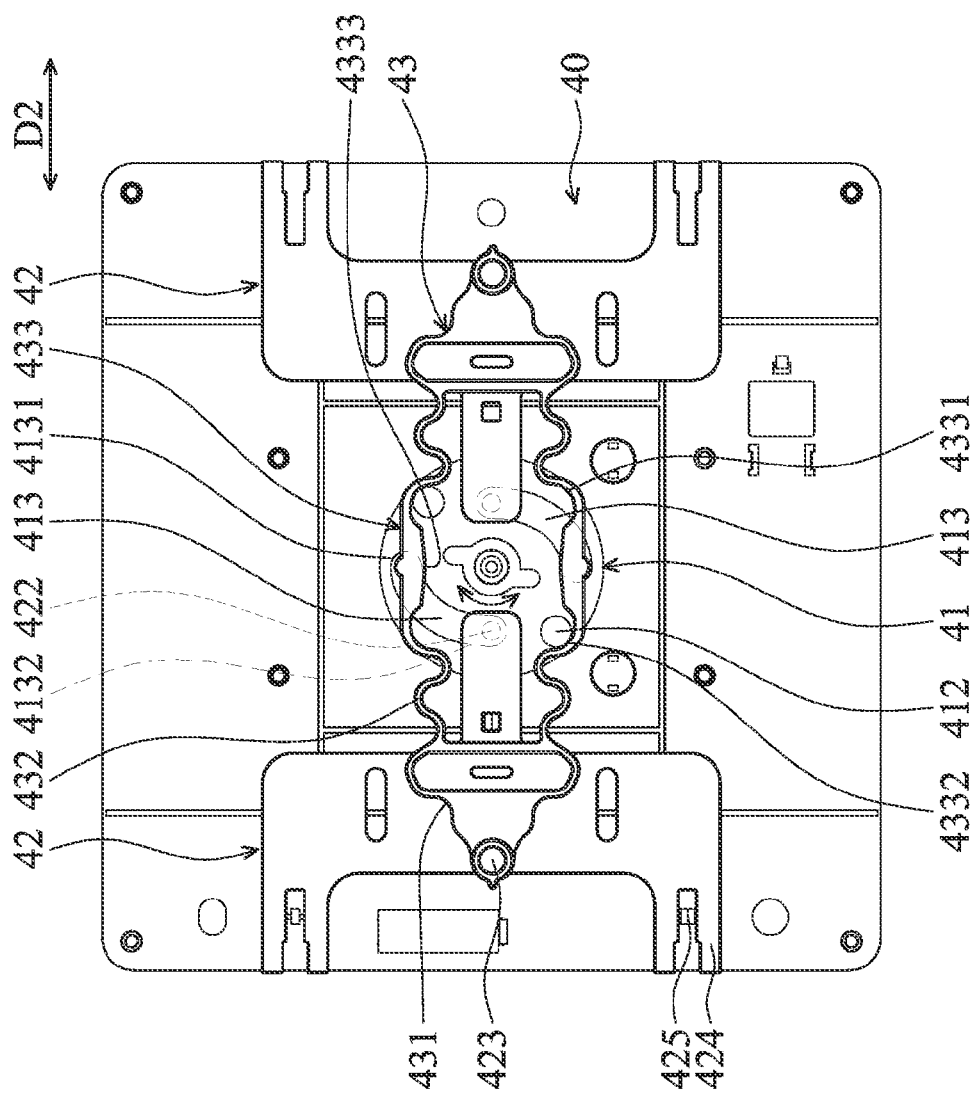
FIG. 10A is a top view of the pod door without a top cover in an unlocked state in accordance with some embodiments of the disclosure.
Figure 10B:
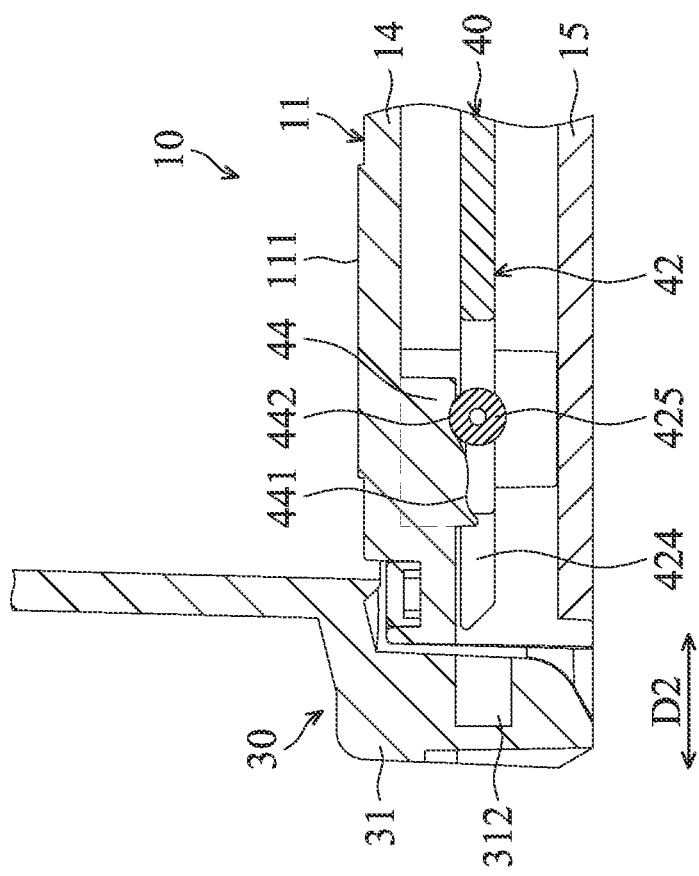
FIG. 10B is a cross-sectional view of a pod shell and the pod door without a top cover in the unlocked state in accordance with some embodiments of the disclosure.

FIG. 9 is a perspective view of pod door 10 without top cover 14 in accordance with some embodiments of the disclosure. FIG. 10A is a top view of pod door 10 without top cover 14 in an unlocked state in accordance with some embodiments of the disclosure. FIG. 10B is a cross-sectional view of pod shell 30 and pod door 10 without top cover 14 in the unlocked state in accordance with some embodiments of the disclosure. Elastic element 43 is disposed on locking body 421 and adjacent to anchor element 412.

Elastic element 43 includes end portions 431, elastic portions 432 and position portions 433. End portion 431 is fixed on fixing element 423. Elastic portion 432 is connected to end portion 431 and position portion 433, and located between end portion 431 and position portion 433. Elastic portion 432 is a curved structure for providing an elastic force by elastic deformation. Position portion 433 is between two adjacent elastic portions 432.

In some embodiments, elastic element 43 is a ring structure. A space S2 (shown in FIGS. 5 and 6) is formed by end portions 431, elastic portions 432 and position portions 433. Anchor elements 412 and pushing elements 422 are located in space S2.

Each of position portions 433 has a first groove 4331, a second groove 4332, and a guiding protrusion 4333 between first groove 4331 and second groove 4332. As shown in FIGS. 9, 10A and 10B, pod door 10 and pod lock 40 are in the unlocked state, and bolt portion 424 is located in pod housing 11. Anchor element 412 is at second groove 4332. Pushing element 422 is at second end 4132.

In some embodiments, as shown FIG. 10A, when rotating element 41 is rotated in a counterclockwise direction, pushing element 422 is moved from second end 4132 to first end 4131. Because of the locations of first end 4131 and second end 4132, rotating element 41 pushes pushing element 422 moving along movement direction D2 to put locking element 42 in a locked state.

Figure 11A:
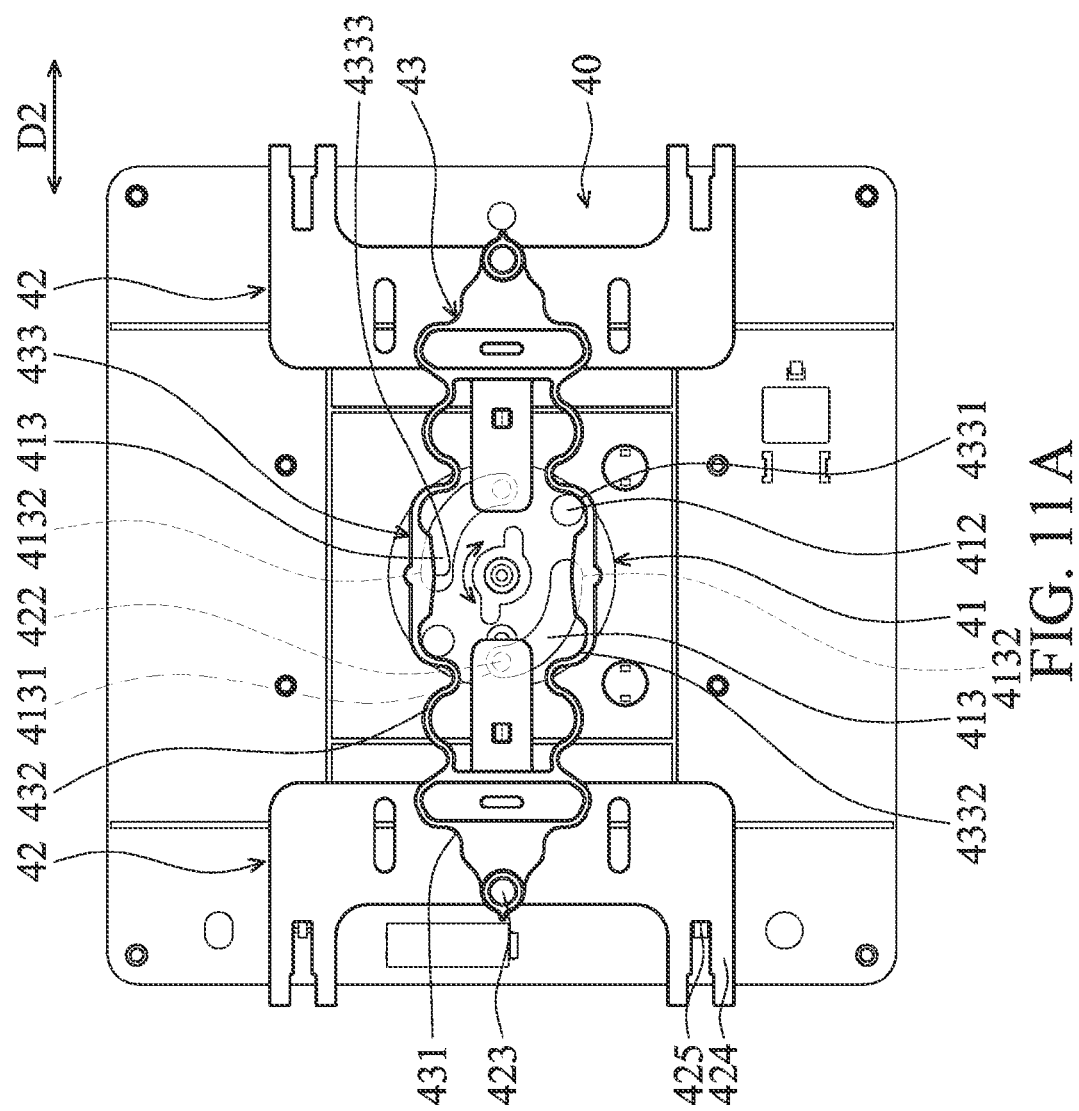
FIG. 11A is a top view of the pod door without a top cover in a locked state in accordance with some embodiments of the disclosure.
Figure 11B:
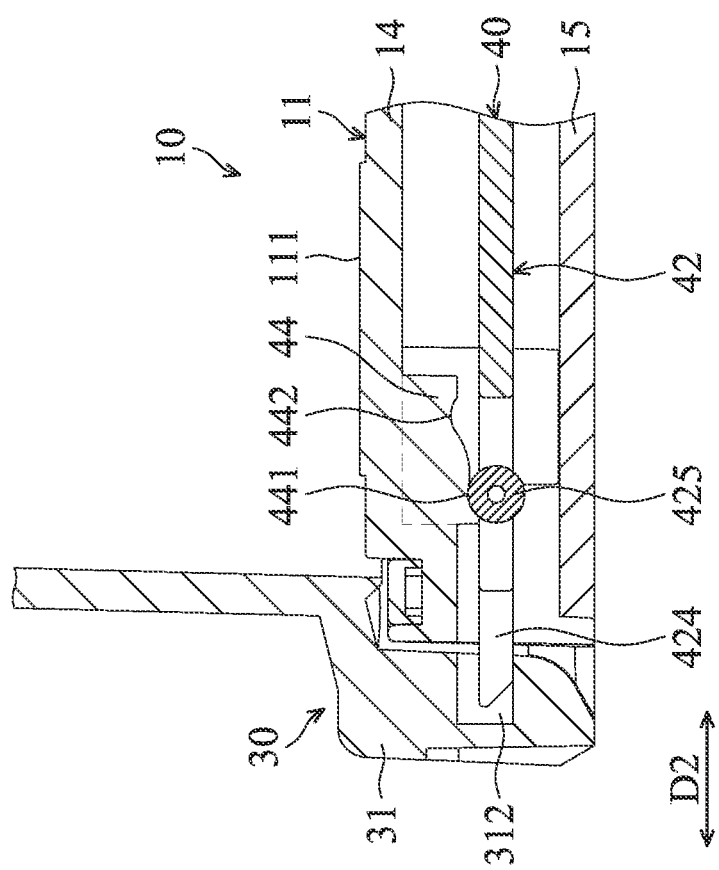
FIG. 11B is a cross-sectional view of the pod shell and the pod door without a top cover in the locked state in accordance with some embodiments of the disclosure.

FIG. 11A is a top view of pod door 10 without top cover 14 in the locked state in accordance with some embodiments of the disclosure. FIG. 11B is a cross-sectional view of pod shell 30 and pod door 10 without top cover 14 in the locked state in accordance with some embodiments of the disclosure. As shown in FIGS. 11A and 11B, pod door 10 and pod lock 40 are in the locked state. Bolt portion 424 is protruded out of pod housing 31 and inserted into a locking opening 312 of pod shell 30. Anchor element 412 is at first groove 4331. Pushing element 422 is at first end 4131.

In some embodiments, as shown FIG. 11A, when rotating element 41 is rotated in a clockwise direction, pushing element 422 is moved from first end 4131 to second end 4132 via guiding protrusion 4333. Because of the locations of first end 4131 and second end 4132, rotating element 41 pushes pushing element 422 moving along movement direction D2 to put locking element 42 in the unlocked state. The connection between rotating element 41 and locking element 42 is strengthened by the structure of rotating element 41 and locking element 42.

Further, when rotating element 41 is rotated in the counterclockwise direction, anchor element 412 is moved from second groove 4332 to first groove 4331 via guiding protrusion 4333. When rotating element 41 is rotated in the clockwise direction, anchor element 412 is moved from first groove 4331 to second groove 4332.

Next, since guiding protrusion 4333 has a curved surface, and anchor element 412 is pivoted on rotating element 41, the friction between anchor element 412 and guiding protrusion 4333 is very small (approaching to zero). When rotating element 41 is rotated by an user, and elastic element 43 contacts with guiding protrusion 4333, guiding protrusion 4333 of elastic element 43 applies an elastic force on anchor element 412, and the user is guided to rotate rotating element 41 to make anchor element 412 located in first groove 4331 or second groove 4332 by guiding protrusion 4333. Therefore, the locations of locking element 42 in the locked and unlocked state are accurately determined according to first groove 4331, second groove 4332, and the elastic force. Pod door 10 is accurately locked on a pod shell 30 in the locked state.

In addition, as shown in FIG. 10B, position element 44 has a first position groove 441 and a second position groove 442. When pod lock 40 is in the unlocked state, sliding element 425 is located at second position groove 442. As shown in FIG. 11B, when pod lock 40 is in the locked state, sliding element 425 is located at first position groove 441. Therefore, the locations of locking element 42 in the locked and unlocked state are also accurately determined according to first position groove 441 and second position groove 442. Pod door 10 is accurately locked on pod shell 30 in the locked state.

In some embodiments, the distance between first position groove 441 and top surface 111 of pod housing 11 exceeds the distance between second position groove 442 and top surface 111. As shown in FIG. 11B, due to the locations of first position groove 441 and second position groove 442, bolt portions 424 abut against the bottom of locking opening 312, and pod door 10 is clamped by pod housing 31. Therefore, pod door 10 is prevented from separating from pod housing 31 in the locked state.

Embodiments of mechanisms for a wafer pod containing at least one wafer are provided. Retaining protrusions and a pod housing are formed as a single piece, and therefore the particles in the wafer pod are decreased. Due to the structure of a pod lock, a pod door is accurately locked on a pod shell, a cassette may not fall from the pod door and break wafers when the wafer pod is transported.

In some embodiments, a pod door of a wafer pod is provided. The pod door includes a pod housing, and a pod lock disposed in the pod housing. The pod lock includes a rotating element pivoted on the pod housing and having an anchor element disposed on the rotating body. The pod lock further includes a locking element including a locking body slidably disposed on the pod housing. The pod lock also includes an elastic element disposed on the locking body, and adjacent to the anchor element. When the rotating element is rotated, the rotating element pushes the locking element to move, and the elastic element applies an elastic force on the anchor element.

In some embodiments, a pod door of a wafer pod is provided. The pod door includes a pod housing, and a pod lock disposed in the pod housing. The pod lock includes a rotating element pivoted on the pod housing. The rotating element includes a rotating body having a rotating groove, and an anchor element disposed on the rotating body. The pod lock further includes a locking element including a locking body slidably disposed on the pod housing and a pushing element disposed on the locking body and movably located in the rotating groove. The pod lock also includes an elastic element disposed on the locking body, and adjacent to the anchor element. When the rotating element is rotated, the rotating element pushes the locking element to move along a movement direction, and the elastic element applies an elastic force on the anchor element.

In some embodiments, a wafer pod for containing at least one wafer is provided. The wafer pod includes a pod door including a pod housing and a pod lock disposed in the pod housing. The pod lock includes a rotating element pivoted on the pod housing and having an anchor element disposed on the rotating body. The pod lock further includes a locking element including a locking body slidably disposed on the pod housing. The pod lock also includes an elastic element disposed on the locking body, and adjacent to the anchor element. The wafer pod further includes a cassette disposed on the pod door and containing the wafers. The wafer pod also includes a pod shell detachably disposed on the pod door and covering the cassette. When the rotating element is rotated, the rotating element pushes the locking element to move and the elastic element applies an elastic force on the anchor element.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A pod door of a wafer pod, comprising:
    a pod housing; and
    a pod lock, disposed in the pod housing, comprising:
        a rotating element, pivoted on the pod housing, having an anchor element disposed on the rotating body;
        a locking element comprising a locking body slidably disposed on the pod housing; and
        an elastic element disposed on the locking body, and adjacent to the anchor element,
    wherein when the rotating element is rotated, the rotating element pushes the locking element to move, and the elastic element applies an elastic force on the anchor element.

2. The pod door as claimed in claim 1, wherein the rotating element comprises a rotating body, and the anchor element pivoted on the rotating body.

3. The pod door as claimed in claim 1, wherein the elastic element is a ring structure, and the anchor element is located in the elastic element.

4. The pod door as claimed in claim 1, wherein the elastic element has a first groove and a second groove, when the pod lock is in a locked state, the anchor element is at the first groove, and when the pod lock is in an unlocked state, the anchor element is at the second groove.

5. The pod door as claimed in claim 1, wherein the rotating element comprising a rotating groove having a first end and a second end, and the locking element comprising a pushing element disposed on the locking body and movably located in the rotating groove, wherein a distance between the first end and a rotation axis of the rotating element exceeds a distance between the second end and the rotation axis, and when the pod lock is in a locked state, the pushing element is at the first end, and when the pod lock is in an unlocked state, the pushing element is at the second end.

6. The pod door as claimed in claim 5, wherein the rotating groove has a curved opening.

7. The pod door as claimed in claim 1, wherein the locking element has a bolt portion extended from the locking body, when the pod lock is in a locked state, the bolt portion is protruded out of the pod housing, and when the pod lock is in an unlocked state, the bolt portion is located in the pod housing.

8. The pod door as claimed in claim 7, wherein the pod lock further comprises a position element disposed in the pod housing, and the locking element comprises a sliding element disposed on the locking element and slidably disposed on the position element, wherein the position element has a first position groove and a second position groove, when the pod lock is in the locked state, the sliding element is located at the first position groove, and when the pod lock is in the unlocked state, the sliding element is located at the second position groove.

9. A pod door of a wafer pod, comprising:
    a pod housing; and
    a pod lock, disposed in the pod housing, comprising:
        a rotating element, pivoted on the pod housing, comprising a rotating body having a rotating groove, and an anchor element disposed on the rotating body;
        a locking element comprising a locking body slidably disposed on the pod housing and a pushing element disposed on the locking body and movably located in the rotating groove; and
        an elastic element disposed on the locking body, and adjacent to the anchor element;
    wherein when the rotating element is rotated, the rotating element pushes the locking element to move along a movement direction, and the elastic element applies an elastic force on the anchor element.

10. The pod door as claimed in claim 9, wherein the rotating groove has a first end and a second end, wherein a distance between the first end and a rotation axis of the rotating element exceeds a distance between the second end and the rotation axis, when the pod lock is in a locked state, the pushing element is at the first end, and when the pod lock is in an unlocked state, the pushing element is at the second end.

11. The pod door as claimed in claim 10, wherein the rotating groove has a curved opening.

12. The pod door as claimed in claim 9, wherein the anchor element is pivoted on the rotating body, the elastic element is a ring structure, and the anchor element is located in the elastic element.

13. The pod door as claimed in claim 9, wherein the elastic element has a first groove and a second groove, when the pod lock is in a locked state, the anchor element is at the first groove, and when the pod lock is in an unlocked state, the anchor element is at the second groove.

14. A wafer pod for containing at least one wafer, comprising:
    a pod door, comprising:
        a pod housing; and
        a pod lock, disposed in the pod housing, comprising:
            a rotating element, pivoted on the pod housing, having an anchor element disposed on the rotating body;
            a locking element comprising a locking body slidably disposed on the pod housing; and
            an elastic element disposed on the locking body, and adjacent to the anchor element;
    a cassette, disposed on the pod door, containing the at least one wafer; and
    a pod shell, detachably disposed on the pod door, covering the cassette, wherein when the rotating element is rotated, the rotating element pushes the locking element to move, and the elastic element applies an elastic force on the anchor element.

15. The wafer pod as claimed in claim 14, wherein the rotating element comprises a rotating body, and the anchor element pivoted on the rotating body.

16. The wafer pod as claimed in claim 14, wherein the elastic element is a ring structure, and the anchor element is located in the elastic element.

17. The wafer pod as claimed in claim 14, wherein the elastic element has a first groove and a second groove, when the pod lock is in a locked state, the anchor element is at the first groove, and when the pod lock is in an unlocked state, the anchor element is at the second groove.

18. The wafer pod as claimed in claim 14, wherein the locking element has a bolt portion extended from the locking body, and the pod shell has a locking opening, when the pod lock is in a locked state, the bolt portion is inserted into the locking opening, and when the pod lock is in an unlocked state, the bolt portion is located in the pod housing.

19. The wafer pod as claimed in claim 14, wherein the rotating element comprising a rotating groove having a first end and a second end, and the locking element comprising a pushing element disposed on the locking body and movably located in the rotating groove, wherein a distance between the first end and a rotation axis of the rotating element exceeds a distance between the second end and the rotation axis, and when the pod lock is in a locked state, the pushing element is at the first end, and when the pod lock is in an unlocked state, the pushing element is at the second end.

20. The wafer pod as claimed in claim 19, wherein the rotating groove has a curved opening.

* * * * *